United States Patent [19]

Morrison

[11] Patent Number: 4,812,743
[45] Date of Patent: Mar. 14, 1989

[54] METHOD AND APPARATUS FOR DETECTING A NARROWBAND SIGNAL

[75] Inventor: Shawn J. Morrison, Saskatoon, Canada

[73] Assignee: Northern Telecom Limited, Montreal, Canada

[21] Appl. No.: 143,993

[22] Filed: Jan. 13, 1988

[51] Int. Cl.$^4$ .............................................. G01R 23/16
[52] U.S. Cl. ..................................... 324/77 R; 324/66
[58] Field of Search .................. 356/73.1; 324/66, 67, 324/77 R, 77 E; 379/25, 26; 328/137, 138, 139

[56] References Cited

U.S. PATENT DOCUMENTS

| | | | |
|---|---|---|---|
| 3,882,287 | 5/1975 | Simmonds | 328/138 |
| 4,458,113 | 7/1984 | Tolman | 324/66 |
| 4,671,653 | 6/1987 | So et al. | 356/73.1 |
| 4,672,198 | 6/1987 | Presby | 356/73.1 |
| 4,686,454 | 8/1987 | Pecukonis | 324/67 |

Primary Examiner—Tom Noland
Assistant Examiner—Louis M. Arana
Attorney, Agent, or Firm—C. W. Junkin

[57] ABSTRACT

In a method and apparatus for discriminating between a broadband unipolar signal having a component within one or more of three predetermined frequency bands and a narrowband signal within one of the frequency bands, a signal under test is amplified by a gain which is inversely proportional to the DC content of the signal under test to normalize the signal under test. The normalized signal is bandpass filtered to attenuate components outside of the predetermined frequency bands and the filtered signal is compared to a reference signal. The signal under test is deemed to be a narrowband signal within one of the predetermined frequency bands if the filtered signal exceeds the reference signal. The method and apparatus are particularly useful for detecting test tones on optical fibers.

9 Claims, 6 Drawing Sheets

METHOD AND APPARATUS FOR DETECTING A NARROWBAND SIGNAL

The present invention relates generally to a method and apparatus for detecting a narrowband signal, and more particularly to a method and apparatus for discriminating between a broadband unipolar signal having a component within at least one predetermined frequency band and a narrowband signal within said at least one frequency band.

When repairing or making branch connections to fiber optic cables, telecommunications workers must avoid cutting traffic carrying fibers in order to prevent service interruptions. Thus, the workers must be able to distinguish spare fibers, which do not carry traffic, from traffic carrying fibers. Portable self contained test instruments have been provided for this purpose.

One such test instrument is described in U.S. Pat. No. 4,671,653 issued June 9, 1987 in the name of Vincent So et al. This instrument includes a pair of jaw members which provide a controlled bend in a fiber when the jaw members are closed on the fiber. One of the jaw members carries an optical detector, and the controlled bend is such as to provide weak optical coupling between the fiber and the detector. The weak optical coupling permits detection of optical signals on the fiber without attenuating the signals to such an extent that service is interrupted.

Telecommunications workers must also identify and verify the continuity of specific spare fibers when repairing or making branch connections to fiber optic cables. The test instrument discussed above may be adapted for this purpose by connecting a tone detection circuit to the optical detector. An optical signal modulated by a narrowband signal at a specific tone frequency may be launched into a specific spare fiber, and that fiber may be identified elsewhere along its length by application of the test instrument and detection of the tone. Detection of the tone also verifies the continuity of the fiber between the launch point and the point at which the test instrument is applied.

In order to be effective, the modified test instrument must be able to distinguish between broadband traffic and specific tones. Otherwise, a traffic carrying fiber may be mistaken for a specific spare fiber, and the traffic carrying fiber may be cut, thereby interrupting service. It may be particularly difficult to distinguish between a relatively strong traffic signal, for example a traffic signal launched into a fiber close to the test site and a relatively weak tone, for example a tone signal launched into a fiber far from the test site, since both signals may have components of similar magnitude at the tone frequency.

The present invention seeks to overcome the above difficulty by providing a method and apparatus for discriminating between a broadband unipolar signal having a component within at least one predetermined frequency band, such as a traffic signal, and a narrowband signal within the at least one frequency band, such as a tone signal.

Thus, according to one aspect of the invention, there is provided: a method for discriminating between a broadband unipolar signal having a component within at least one predetermined frequency band and a narrowband signal within said at least one frequency band, the method comprising: amplifying a signal under test by a gain which decreases monotonically with increasing DC content in the signal under test; bandpass filtering the amplified signal to attenuate components of the amplified signal outside of said at least one frequency band; and comparing the filtered signal to a reference signal, the signal under test being deemed to be a narrowband signal within said at least one frequency band when the filtered signal exceeds the reference signal.

According to another aspect of the invention, there is provided: apparatus for discriminating between a broadband unipolar signal having a component within at least one predetermined frequency band and a narrowband signal within said at least one frequency band, the apparatus comprising: amplifier means having a gain which decreases monotonically with increasing DC content of a signal under test appearing at an input of the amplifier means; bandpass filter means responsive to an output of the amplifier means and having at least one passband corresponding to said at least one frequency band; and comparator means having a first input responsive to an output responsive to a reference signal to apply a first signal to an output of the comparator means when the reference signal exceeds the output of the bandpass filter means and to apply a second signal different from said first signal to said output of the comparator means when the output of the bandpass filter exceeds the reference signal.

Because the gain of the amplifying means decreases monotonically with increasing DC content of the signal under test, strong signals will be amplified less than weak signals. Thus, the amplifying means normalizes the magnitude of the signal under test. The normalized signal will have significant energy within a specific passband only if a significant proportion of the total signal energy is within that passband. A normalized broadband signal will have less energy within a specific passband than a normalized narrowband or tone signal centered on that passband. By bandpass filtering the normalized signal to attenuate components outside of the passband and comparing the filtered signal to a suitably calibrated reference signal, a broadband signal may be distinguished from a narrowband signal.

Preferably, the gain of the amplifying means is inversely proportional to the DC content of the signal under test, and the normalized signal is rectified and low pass filtered before comparison with a DC reference signal. Where narrowband or tone signals at any one of a plurality of optional tone frequencies are to be accommodated, the normalized signal may be passed through a plurality of bandpass filters and the outputs of the bandpass filters may be summed to obtain the filtered signal.

An embodiment of the invention will now be described by way of example only with reference to the accompanying drawings, in which.

Figure 1:
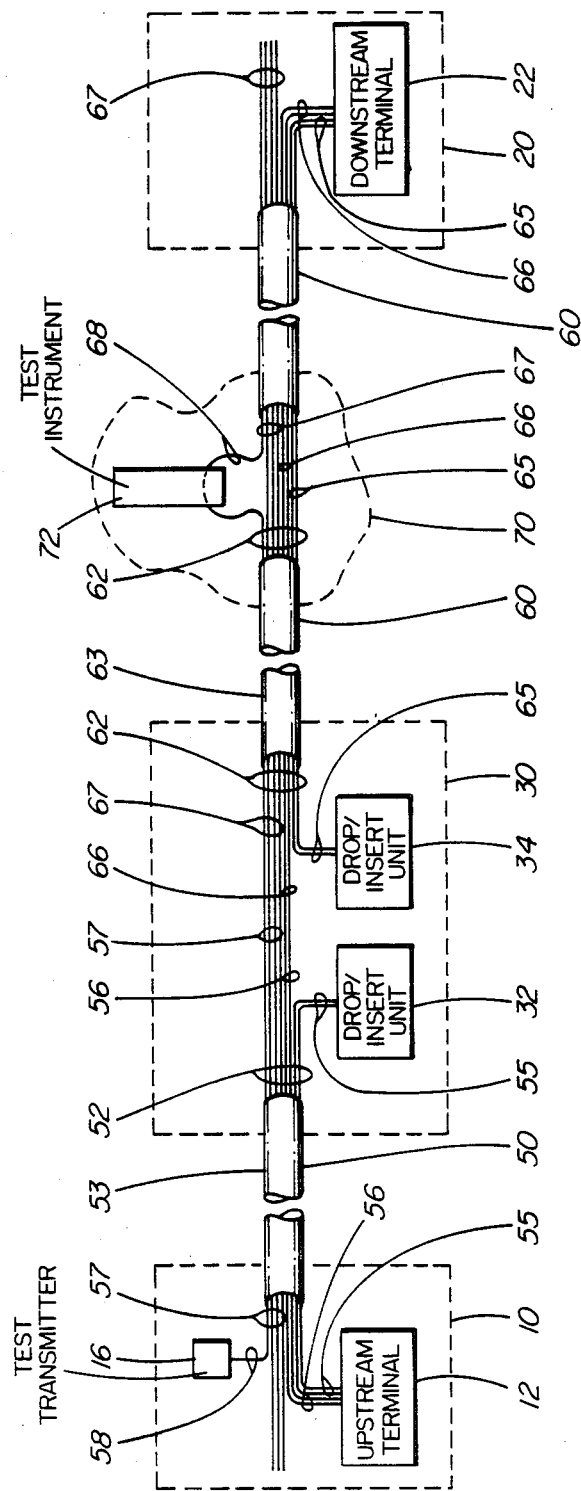
FIG. 1 is a schematic diagram of a fiber optic transmission system showing an upstream terminal site, a downstream terminal site, a drop/insert site between the upstream and downstream terminal sites and a test site between the drop/insert site and the downstream terminal site.

Referring to FIG. 1, a fiber optic transmission system provides a communication link between an upstream terminal site 10 and a downstream terminal site 20 by way of a drop/insert site 30. The transmission system comprises an upstream terminal 12 at the upstream site 10, a downstream terminal 22 at the downstream site 20, drop/insert units 32,34 at the drop/insert site 30, and fiber optic cable sections 50,60 extending from the upstream site 10 to the drop/insert site 30 and from the drop/insert site 30 to the downstream site 20 respectively.

Each cable section 50,60 comprises eight optical fibers 52,62 carried in a common sheath 53,63. Of the eight fibers 52,62 in each cable, one pair 55,65 is used to connect the terminals 12,22 to respective drop/insert units 32,34, another pair 55,66 is used to directly connect the terminals 12,22 and the remaining four fibers 57,67 are spare fibers. Thus, in use of the transmission system, one pair 55,65 of fibers 52,62 in each cable section 50,60 carries drop/insert traffic between the terminals 12,22 and the drop/insert units 32,34, another pair 56,66 of fibers 52,62 in each cable section 50,60 carries end-to-end traffic directly between the terminals 12,22, and the remaining fibers 57,67 carry no traffic.

It may be necessary to identify a specific one of the spare fibers 67 at a test site 70 on one of the cable section 60. For example, it may be desirable to use the fiber 68 in a transmission link requiring a branch connection at the test site 70. To this end, a test transmitter 16 is connected to one fiber 58 of the spare fibers 57 at the upstream terminal site 10. An optical signal modulated by a narrowband unipolar signal at a specific tone frequency, $f_t$, is launched from the test transmitter 16 through the selected spare fiber 58 and into the corresponding spare fiber 68 in the next cable section 60. A test instrument 72 is connected to each fiber 62 in turn at the test site 70 until a fiber carrying a signal modulated at the tone frequency, $f_t$, is found. This fiber must be the desired fiber 68.

The test instrument 72 must be able to distinguish an optical signal modulated by a narrowband unipolar signal at a specific tone frequency, $f_t$, from an optical signal associated with traffic. Otherwise the desired spare fiber 68 may be confused with traffic carrying fibers 65,66, and traffic may be interrupted causing a service outage.

Figure 2:
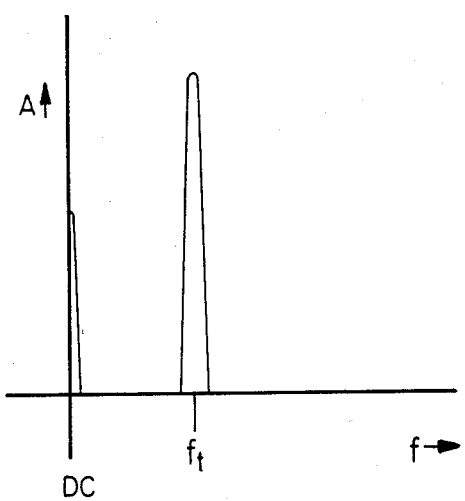
FIG. 2 is a graph representing the spectrum of a narrowband unipolar signal launched at the upstream terminal site.
Figure 3:
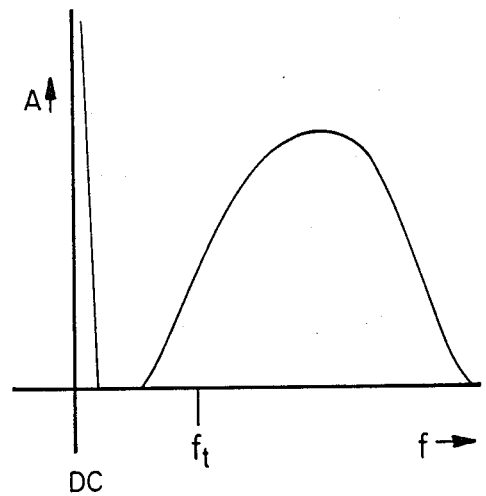
FIG. 3 is a graph representing the spectrum of a broadband unipolar signal launched at the drop/insert site.
Figure 4:
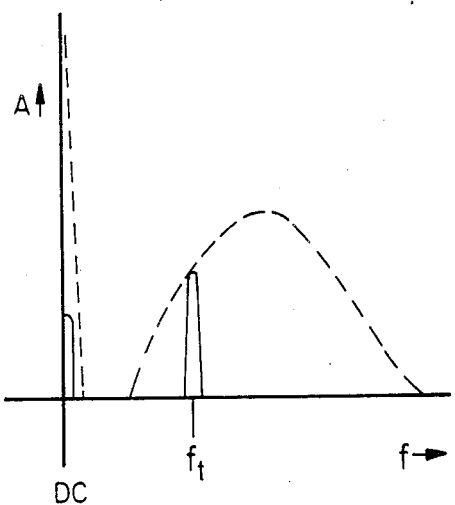
FIG. 4 is a graph showing the spectrum of a broadband signal detected at the test site superimposed on the spectrum of a narrowband unipolar signal detected at the test site.

The narrowband unipolar signal has a signal spectrum as illustrated in FIG. 2, while the signal associated with traffic is a broadband unipolar signal as illustrated in FIG. 3. Because the broadband and narrowband signals are launched at different locations on the communications link they may have different amplitudes at the test site 70. For example, a broadband signal launched from the drop/insert unit 34 at the drop/insert 30 will have a greater amplitude at the test site 70 than a narrowband signal launched from the test transmitter 16 at the upstream site 10. Hence, as illustrated in FIG. 4, the broadband signal (shown as a dotted line) may have a greater amplitude at the tone frequency, $f_t$, than the narrowband signal (shown as a solid line), even though a greater proportion of the narrowband signal energy is concentrated at $f_t$. The test instrument 72 must be able to discriminate between the broadband signal and the narrowband signal in spite of such differences in amplitude.

Figure 5:
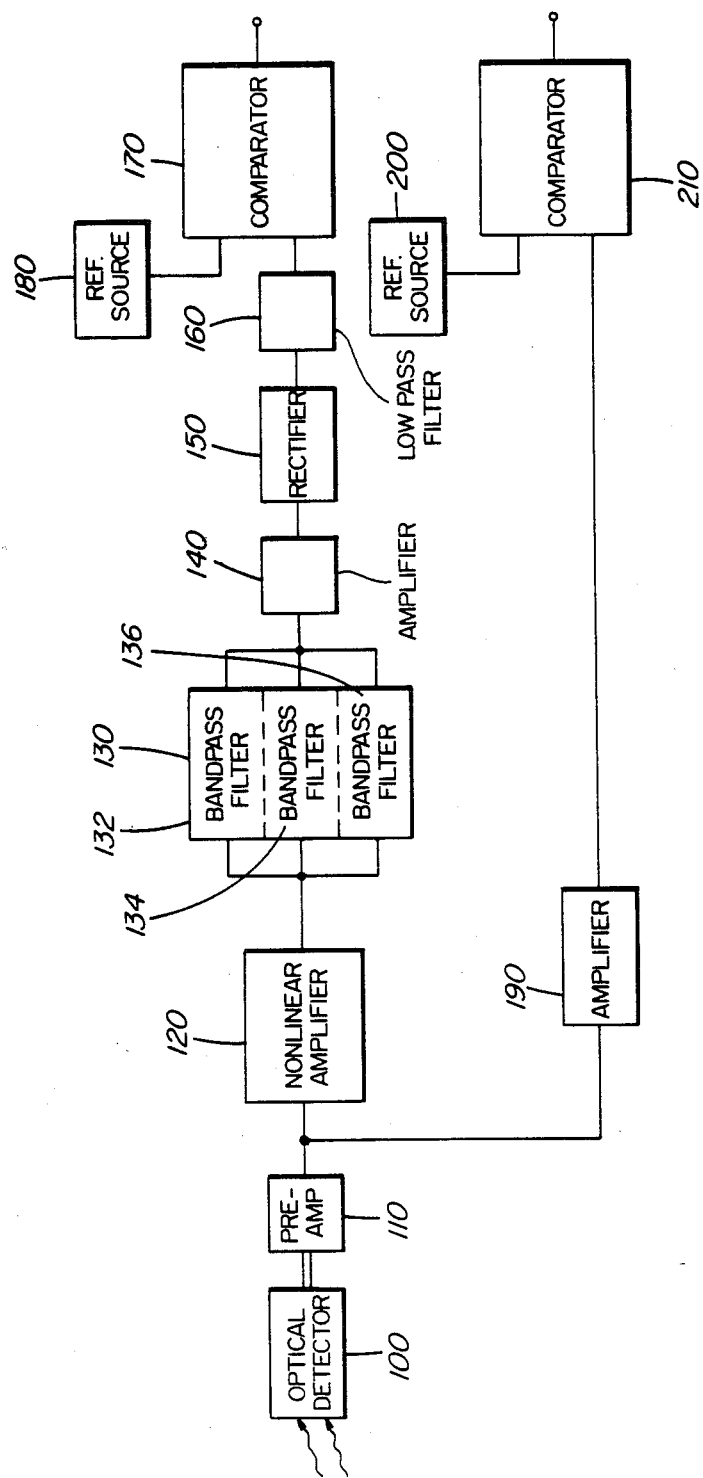
FIG. 5 is a block diagram of a system for discriminating a broadband unipolar signal from a narrowband unipolar signal within any one of three specific frequency bands.

A functional block diagram of the test instrument 72 is shown is FIG. 5. The test instrument 72 includes an optical detector 100 having an output connected to a preamplifier 110. The preamplifier 110 has an output connected to a non-linear amplifier 120 which has a gain which decreases monotonically with increasing DC content in the signal supplied by the preamplifier 110. The amplifier 120 feeds a filter device 130 comprising three bandpass filters 132,134,136 which are connected in parallel. The outputs of the bandpass filters 132,134,136 are connected to a linear amplifier 140 which drives a rectifier 150 in series with a low pass filter 160. A comparator 170 is connected to an output of the low pass filter 160 and to a reference signal source 180.

The output of the preamplifier 110 is also connected to an amplifier 190. The amplifier 190 and a reference signal source 200 feed a comparator 210.

Figure 6:
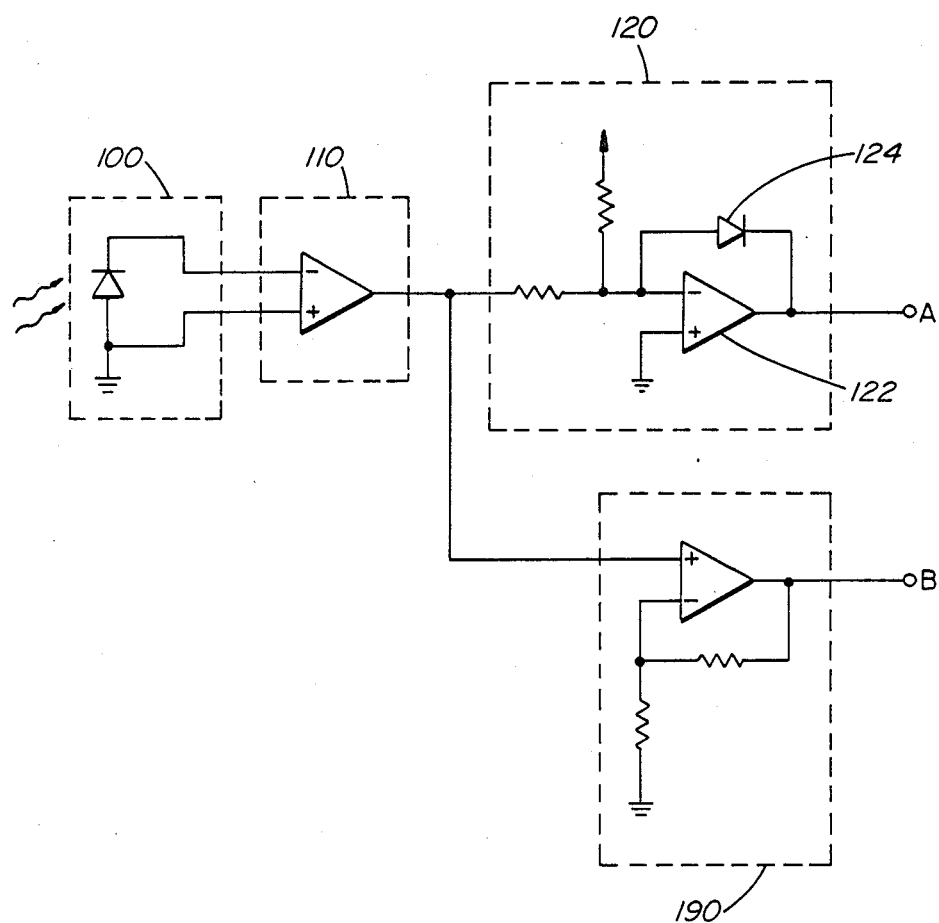
FIG. 6 is a schematic diagram of a first part of a circuit implementing the block diagram of FIG. 6.
Figure 7:
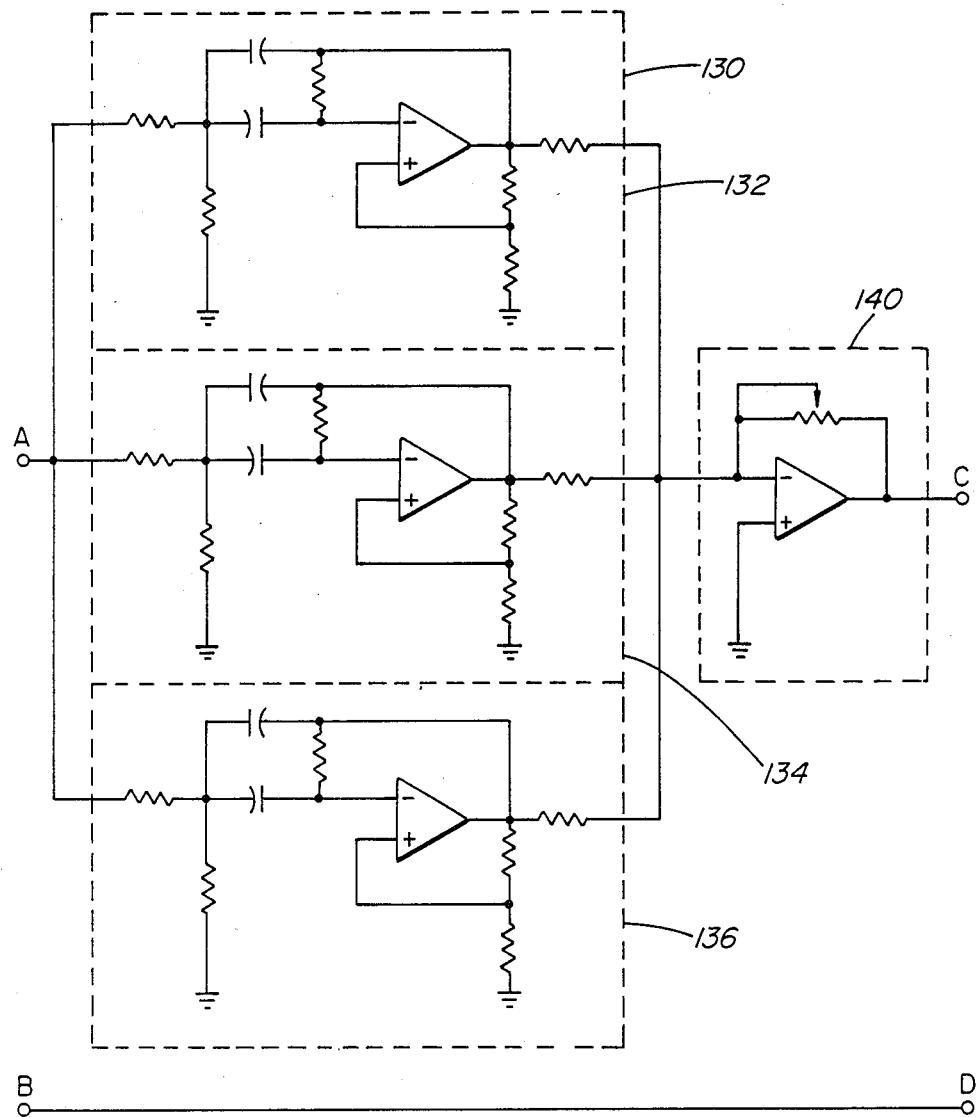
FIG. 7 is a schematic diagram of a second part of a circuit implementing the block diagram of FIG. 6.
Figure 8:
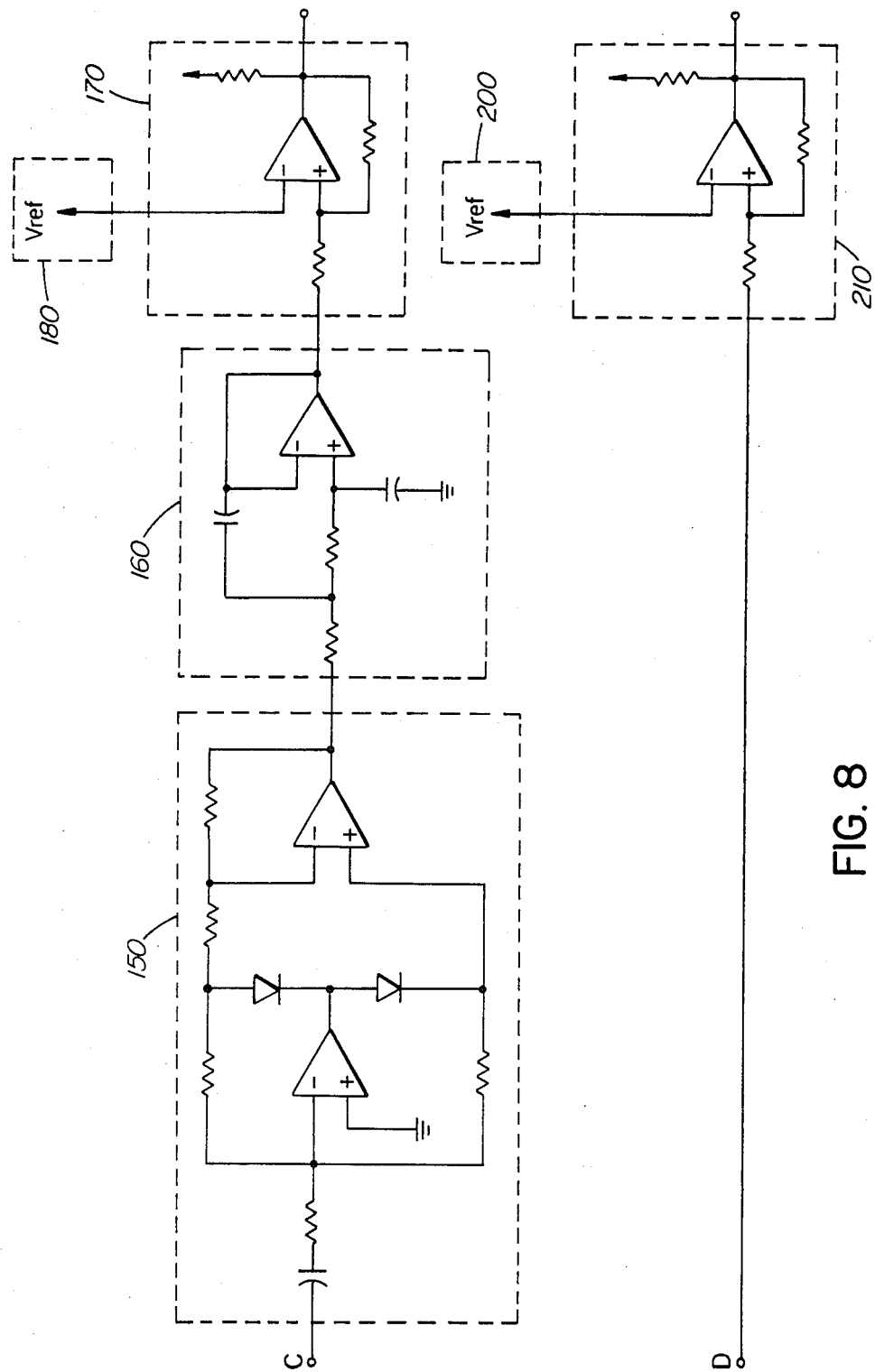
FIG. 8 is a schematic diagram of a third part of a circuit implementing the block diagram of FIG. 8.

Schematic diagrams showing preferred circuit implementations of the functional block diagram of FIG. 5 are provided in FIGS. 6,7 and 8. Corresponding reference numerals are used to identify functional blocks in FIG. 5 and their circuit implementations in FIGS. 6,7 and 8.

The non-linear amplifier 120 comprises an operational amplifier 122 connected in feedback configuration with a diode 124 in the feedback path. This arrangement provides an amplifier having a gain which is inversely proportional to the DC content of the signal supplied by the preamplifier 110.

The circuit implementations of other functional blocks are known and need not be described in detail.

In use of the test instrument 72, the optical detector 100 is coupled to a selected fiber so that a small portion of any optical signal propagating on the fiber will be incident on the detector. Any detected signal is preamplified by the preamplifier 110 and fed to the nonlinear amplifier 120.

Figure 9:
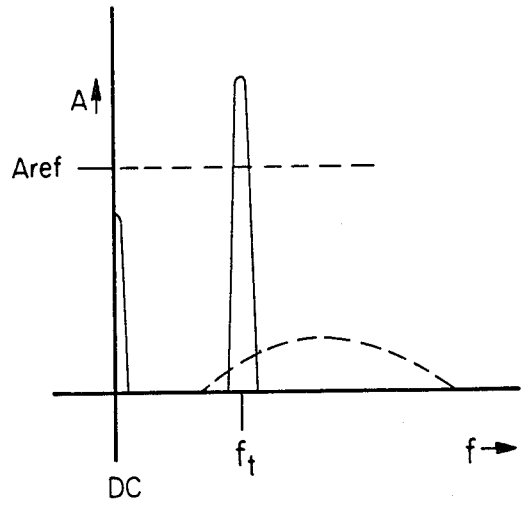
FIG. 9 is a graph showing the spectrum of a normalized broadband unipolar signal superimposed on the spectrum of a normalized narrowband unipolar signal.

The non-linear amplifier 120 amplifies the preamplified signal by a gain which, in the circuit implementation shown in FIG. 6, is inversely proportional to the DC content of the amplified signal. Consequently, relatively weak unipolar signals will be amplified more than relatively strong unipolar signals. For example, the relatively weak narrowband unipolar signal shown in solid line in FIG. 4 and the relatively strong broadband unipolar signal shown in dotted line in FIG. 4 would be amplified by different amounts to provide corresponding output signals having essentially equal DC components as shown in FIG. 9. Thus, the non-linear amplifier normalizes the preamplified signal according to its DC content.

The normalized signal is applied to the bandpass filters 132,134,136 which attenuate components outside of specific passbands. The passbands of the filters are chosen to correspond to specific tone frequencies which may be applied at the test transmitter 16.

Narrowband signals originating at the test transmitter 16 will provide normalized signals having much more signal energy in one of the filter passbands than will broadband traffic signals originating at one of the terminals 12,22 or drop/insert units 32,34. Consequently, the bandpass filters 132,134,136 will provide a significant output signal only if the detected signal originated at the test transmitter 16.

The output signals of the bandpass filters 132,134,136 are summed, and the resulting signal is rectified and low pass filtered before being compared to a reference signal at the comparator 170. The comparator provides a first output signal if the rectified and filtered signal exceeds the reference signal. The presence of the first output signal signifies that a narrowband signal has been detected and that the selected fiber is the desired one.

If the rectified and filtered signal does not exceed the reference signal, then the comparator provides a second output signal. The presence of the second output signal indicates that no signal originating at the test transmitter 16 is propagating on the selected fiber. In this case, the selected fiber is not the desired one, or there is a discontinuity in the fiber between the test transmitter and the test instrument 72.

The preamplified signal is also amplified at amplifier 190, and the resulting amplified signal is compared to a reference signal at comparator 210. The comparator 210 provides an output signal which indicates whether the amplified signal exceeds the reference signal. The amplified signal exceeds the reference signal if there is any detectable optical signal propagating on the selected fiber. Thus, the output of comparator 210 is useful for determining whether a signal other than a tone modulated signal originating at the test transmitter 16 is propagating on the selected fiber, for example a traffic carrying signal originating at one of the terminals 12,22 or drop/insert units 32,34.

A greater or lesser number of bandpass filters may be provided according to the number of test tone frequencies which may be used. The outputs of the bandpass filters may be individually compared to reference signals in order to determine which specific tone frequency is present on the selected fiber. Alternative circuit implementations of the functional blocks may be employed. All these and other modifications of the disclosed embodiment are within the scope of the invention.

What is claimed is:

1. A method for discriminating between a broadband unipolar signal having a component within at least one predetermined frequency band and a narrowband signal within said at least one frequency band, the method comprising:
    amplifying a signal under test by a gain which decreases monotonically with increasing DC content in the signal under test;
    bandpass filtering the amplified signal to attenuate components of the amplified signal outside of said at least one frequency band; and
    comparing the filtered signal to a reference signal, the signal under test being deemed to be a narrowband signal within said at least one frequency band when the filtered signal exceeds the reference signal.

2. A method as defined in claim 1 for discriminating between a broadband unipolar signal having a component within any one of a plurality of predetermined frequency bands and a narrowband signal within at least one of said frequency bands, wherein the step of bandpass filtering the amplified signal comprises passing the amplified signal through a plurality of bandpass filters connected in parallel, each bandpass filter having a passband corresponding to one of said frequency bands, and summing outputs of the bandpass filters to obtain said filtered signal.

3. A method as defined in claim 1 or 2, wherein the gain is inversely proportional to the DC content of the signal under test.

4. A method as defined in claim 1 or claim 2, wherein the filtered signal is rectified and low pass filtered before comparison with a DC reference signal.

5. Apparatus for discriminating between a broadband unipolar signal having a component within at least one predetermined frequency band and a narrowband signal within said at least one frequency band, the apparatus comprising:
    amplifier means having a gain which decreases monotonically with increasing DC content of a signal under test appearing at an input of the amplifier means;
    bandpass filter means responsive to an output of the amplifier means and having at least one passband corresponding to said at least one frequency band; and
    comparator means having a first input responsive to an output responsive to a reference signal to apply a first signal to an output of the comparator means when the reference signal exceeds the output of the bandpass filter means and to apply a second signal different from said first signal to said output of the comparator means when the output of the bandpass filter exceeds the reference signal.

6. Apparatus as defined in claim 5 for discriminating between a broadband unipolar signal having a component within any one of a plurality of predetermined frequency bands, and a narrowband signal within at least one of said frequency bands, wherein the bandpass filter means comprises a plurality of bandpass filters connected in parallel, each bandpass filter having a passband corresponding to one of said frequency bands and means for summing outputs of the bandpass filters.

7. Apparatus as defined in claim 5, wherein the amplifier means has a gain which is inversely proportional to the DC content of the signal under test.

8. Apparatus as defined in claim 7, wherein the amplifier means comprises an operational amplifier connected in a negative feedback configuration with a diode in the feedback path.

9. Apparatus as defined in claim 5, further comprising rectifying means and low pass filter means connected in series between the bandpass filter means and the comparator means.

* * * * *